(12) United States Patent
Huang et al.

(10) Patent No.: US 6,787,860 B1
(45) Date of Patent: Sep. 7, 2004

(54) APPARATUS AND METHOD FOR INHIBITING DUMMY CELL OVER ERASE

(75) Inventors: Jen-Ren Huang, Hsinchu (TW); Ming-Hung Chou, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/426,833

(22) Filed: May 1, 2003

(51) Int. Cl.$^7$ .............................................. H01L 29/76

(52) U.S. Cl. ...................... 257/390; 257/324; 257/208; 438/128; 438/129

(58) Field of Search ................................ 257/208, 209, 257/211, 314, 321, 324, 390, 411; 438/216, 261, 591, 593, 128, 129

(56) References Cited

U.S. PATENT DOCUMENTS 6,461,906 B1 * 10/2002 Lung ......................... 438/216
6,493,261 B1 * 12/2002 Hamilton et al. ...... 365/185.11

* cited by examiner

Primary Examiner—Minh-Loan T. Tran
(74) Attorney, Agent, or Firm—Finnegan, Henderson, Farabow, Garrett & Dunner, L.L.P.

(57) ABSTRACT

A semiconductor device that includes a semiconductor substrate including a memory cell region and a dummy cell region, a plurality of substantially parallel bit lines in the semiconductor substrate, a plurality of memory cell gate dielectrics provided over the bit lines in the memory cell region, the memory cell gate dielectrics comprising an oxide-nitrideoxide (ONO) layer, a plurality of dummy cell gate dielectrics provided over the plurality of bit lines in the dummy cell region, wherein the dummy cell gate dielectrics is non-trapping for electric charges, and a plurality of substantially parallel word lines over the memory cell gate dielectrics and the dummy cell gate dielectrics.

18 Claims, 2 Drawing Sheets

APPARATUS AND METHOD FOR INHIBITING DUMMY CELL OVER ERASE

RELATED APPLICATION

This application is related to U.S. application Ser. No. 10/214,770, filed Aug. 9, 2002, entitled "Memory Device and Operation Thereof." This related application is expressly incorporated herein by reference.

DESCRIPTION OF THE INVENTION

1. Field of the Invention

This invention relates to a semiconductor device manufacturing method, and particularly to a method for inhibiting dummy cell over-erase in a memory device.

2. Background of the Invention

A memory device conventionally may include a transistor that serves as a memory cell coupled to a word line and a bit line. A conventional nitride read only memory (NROM) cell includes a substrate having a source region spaced-apart from a drain region, and a channel region therebetween. The NROM cell also includes an oxide-nitride-oxide (ONO) structure formed over the channel region and portions of the source and drain regions. The ONO structure includes a first oxide layer formed over the substrate, a nitride layer formed over the first oxide layer, and a second oxide layer formed over the nitride layer. The NROM cell further includes a gate structure formed over the second oxide layer, and sidewall spacers formed contiguous with at least the gate structure. The nitride layer "stores " electrical charges by trapping electrons therein, and the thickness of the first and second oxide layers should be sufficient to prevent leakage, i.e., direct tunneling of stored electrons under normal operating conditions.

Multiple memory cells, including the NROM cells, may form a memory array, which generally includes the memory cells coupled to a grid of word lines and bit lines. During formation of the memory device, the memory lines (word lines and bit lines) at the edges of the device are often etched partially or completely, rendering unusable the memory cells to which they are connected. To protect a usable memory cell from damage, the memory device may include, at an edge, a dummy word line (i.e., a word line not used for programming). The dummy word line may not be coupled to a word line driver, thus each memory cell connected to the dummy word line will not be used to store data—i.e., it is a dummy cell. Consequently, etching of the dummy word line during formation will not result in loss of usable memory.

Conventionally, the dummy word line at the edge is continuously coupled to ground. Thus, regardless of the voltage applied to a corresponding bit line (whether a program or erase voltage), the dummy cell is in a constant state of being weakly erased, which leads to over-erasure of the dummy cell in certain situations. In addition, the state of the dummy cells may result in bit line to bit line current leakage both in the dummy cells and the memory cells during read operations of the memory cells.

SUMMARY OF THE INVENTION

In accordance with the present invention, there is provided a semiconductor device that includes a semiconductor substrate including a memory cell region and a dummy cell region, a plurality of substantially parallel bit lines in the semiconductor substrate, a plurality of memory cell gate dielectrics provided over the bit lines in the memory cell region, the memory cell gate dielectrics comprising an oxide-nitride-oxide (ONO) layer, a plurality of dummy cell gate dielectrics provided over the plurality of bit lines in the dummy cell region, wherein the dummy cell gate dielectrics is non-trapping for electric charges, and a plurality of substantially parallel word lines over the memory cell gate dielectrics and the dummy cell gate dielectrics.

Also in accordance with the present invention, there is provided a method for manufacturing a semiconductor device that includes providing a semiconductor substrate, providing a memory cell region and a dummy cell region in the semiconductor substrate, forming a plurality of bit lines in the semiconductor substrate, providing an oxide-nitride-oxide layer over the plurality of bit lines in the memory cell region, providing a layer of non-trapping material over the plurality of bit lines in the dummy cell region, wherein the non-trapping material comprises an oxide, and providing a plurality of word lines over the oxide-nitride-oxide layer and the layer of non-trapping material in the memory cell region and the dummy cell region.

Still in accordance with the present invention, there is provided a method for manufacturing a semiconductor device that includes providing a semiconductor substrate, providing a memory cell region and a dummy cell region in the semiconductor substrate, forming at least one memory cell in the memory cell region, including providing a first source region and a first drain region in the semiconductor substrate, providing an oxide-nitride-oxide layer over the first source and drain regions, patterning and etching the oxide-nitrde-oxide layer to form at least one gate dielectric, and providing a first gate over the at least one gate dielectric, and forming at least one dummy cell in the dummy cell region, including providing a second source region and a second drain region in the semiconductor substrate, providing a layer of non-trapping material over the second source and drain regions, wherein the non-trapping material comprises silicon dioxide or aluminum oxide, patterning and etching the first oxide layer of non-trapping material to form at least one dummy gate dielectric, and providing a second gate over the layer of non-trapping material.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF THE EMBODIMENTS

In an embodiment of the present invention, the multilayer ONO structure in a dummy cell region is replaced by a layer that decreases, or prevents, electric charges from being trapped therein, and therefore decreases or prevents over-erasure of the dummy cells and the related disadvantages thereto in the conventional ONO layer. The layer of non-trapping material may comprise any material that does not trap electric charges, such as oxide, silicon dioxide or aluminum oxide. To facilitate description, it is assumed that an oxide layer is used as the layer of non-trapping material. The oxide layer may have the same thickness as the conventional ONO layer to provide a substantially planar profile in the memory device. In addition, the bit line widths under the word lines are decreased, which translates into the dummy cells having longer channel lengths than those of memory cells, to further decrease, or eliminate, the over-erasure issue of the dummy cells.

The method of the present invention forms a memory device by forming a plurality of bit lines, or diffused regions, in a semiconductor substrate to serve as the source/drain regions for the transistors for both the memory and dummy cells. One multi-layer of oxide-nitride-oxide (ONO) is provided over the substrate between the bit lines for each of the memory cell in the memory cell region. An oxide layer is formed over the substrate between the bit lines for each of the dummy cell in the dummy cell region. A gate, or word line, is deposited over the ONO or oxide layer of the respective regions. Conventional semiconductor manufacturing processes follow to complete the formation of the memory and dummy cells, and ultimately, the memory device.

Figure 1:
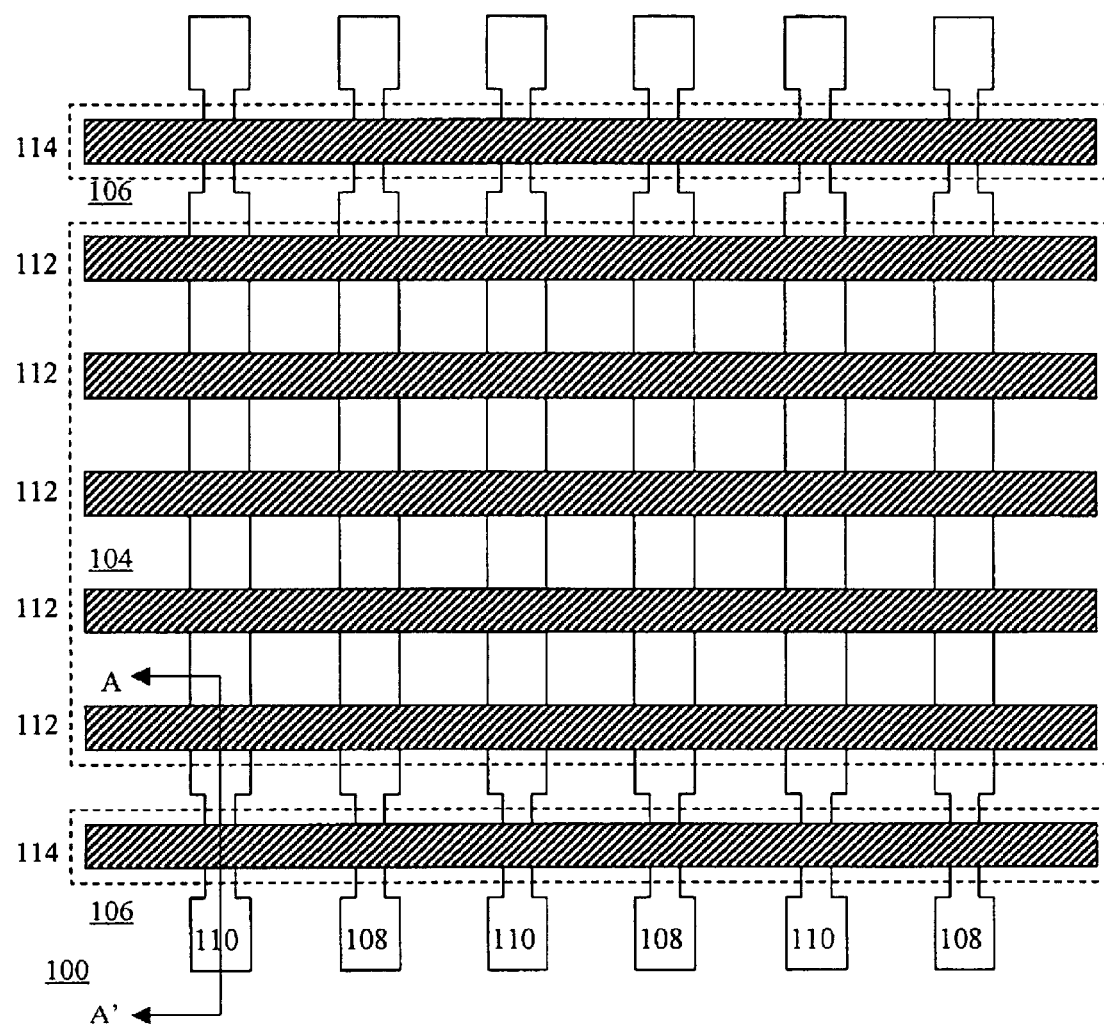
FIG. 1 shows a top view of a nitride read-only memory device (NROM) memory array consistent with one embodiment of the present invention.

FIG. 1 shows a top view of a nitride read-only memory device (NROM) memory array 100 consistent with one embodiment of the present invention. Memory array 100 includes a semiconductor substrate (not shown) having a memory cell region 104 with a plurality of memory cells (not shown) formed therein and dummy cell regions 106 with a plurality of dummy cells (not shown) formed therein. Dummy cell region 106 may be formed on either or both sides of memory cell region 104. A plurality of substantially parallel bit-line pairs 108 and 110 are formed in the substrate, each bit-line pair represents the source and drain regions of a cell, or transistor. Each pair of bit lines 108 and 110 define a column of memory cells and dummy cells. One skilled in the art would understand that the designation of "source" and "drain " regions for bit lines 108 and 110 are not important for purposes of the present invention.

Referring to FIG. 1, a plurality of substantially parallel first word lines 112 in memory cell region 104 are formed over the substrate and bit lines 108 and 110, each of the plurality of first word lines 112 is substantially perpendicular to bit lines 108 and 110. In addition, a plurality of second word lines 114 in dummy cell regions 106 are formed over the substrate and bit lines 108 and 110, and are provided substantially perpendicular to bit lines 108 and 110. First word lines 112 and second word lines 114 functionally serve as the gates of transistors for the memory cells and dummy cells, respectively.

In operations, during the programming cycle of the memory device, one of a selected pair of bit lines 108 and 110 are biased such that one of the pair, e.g., bit line 108, is biased at 5~8.2V, the other of the pair, i.e., bit line 110, is biased at 0V. One of first word lines 112 in memory cell region 104 is also selected to be biased at 11.5V, while second word lines 114 in dummy cell regions 106 are coupled to ground. The substrate is always grounded. Under such a bias condition, a bit of datum is being written into a memory cell selected by the selected bit lines and word line.

When the memory device is to be erased, one of each pair of bit lines, for example, bit line 108, is biased at 7.5V, and all the other bit lines are floating. First word lines 112 are coupled to a high voltage at 11.5V, and second word lines 114 are coupled to ground. The substrate is still grounded in this case.

Figure 2:
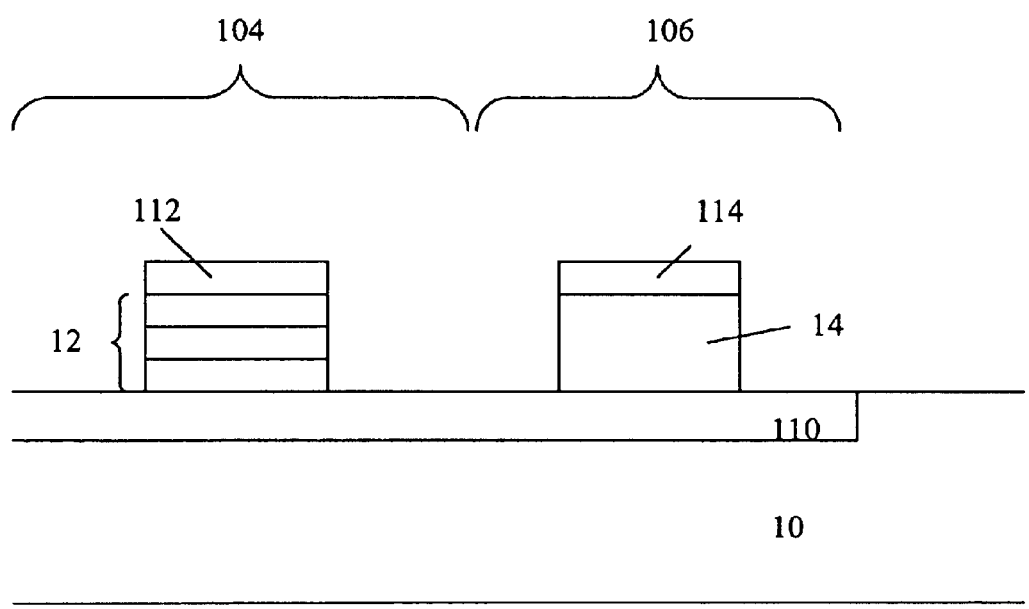
FIG. 2 shows a cross-sectional view of the memory device of FIG. 1 taken along line A–A'.

FIG. 2 shows a cross-sectional view of the memory device of FIG. 1 taken along line A–A'. Referring to FIG. 2, a manufacturing method of such a memory device comprises forming bit lines (drain/source regions) 110 and 108 (not shown) in a semiconductor substrate 10, wherein the substrate 10 includes a memory cell region 104 and a dummy cell region 106. The method of the present invention continues by masking the entire substrate except the memory cell region 104. A multi-layer ONO layer (not shown) is then provided in sequence over the memory cell region 104 through any conventional method. The ONO layer is then patterned and etched using conventional processes to form a plurality of gate dielectrics. 12.

A photoresist (not shown) is again provided over the entire substrate, exposing only the dummy cell region(s) 106. A layer of oxide (not shown) is then provided over the dummy cell region(s) 106. The oxide layer is patterned and etched to form a plurality of dummy cell gate dielectrics 14 between the drain/source regions. Memory cell gates 112 Gates, or word lines, are deposited over the memory cell gate dielectrics 12, and dummy cell gates 114 are deposited over the dummy cell gate dielectrics 14. Conventional semiconductor manufacturing processes follow to complete the formation of the memory and dummy cells, and ultimately, the memory device.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A semiconductor device, comprising:
   a semiconductor substrate including a memory cell region and a dummy cell region;
   a plurality of substantially parallel bit lines in the semiconductor substrate;
   a plurality of memory cell gate dielectrics provided over the bit lines in the memory cell region, the memory cell gate dielectrics comprising an oxide-nitride-oxide (ONO) layer;
   a plurality of dummy cell gate dielectrics provided over the plurality of bit lines in the dummy cell region, wherein the dummy cell gate dielectrics is non-trapping for electric charges; and
   a plurality of substantially parallel word lines over the memory cell gate dielectrics and the dummy cell gate dielectrics.

2. The device as claimed in claim 1, wherein the dummy cell gate dielectrics comprises silicon oxide.

3. The device as claimed in claim 1, wherein the dummy cell gate dielectrics comprises aluminum oxide.

4. The device as claimed in claim 1, wherein the dummy cell gate dielectrics has a same thickness as the memory cell gate dielectrics.

5. The device as claimed in claim 1, wherein a width of the bit lines under the word lines in the dummy cell region is smaller than a width of the bit lines under the word lines in the memory cell region.

6. A method for manufacturing a semiconductor device, comprising:
   providing a semiconductor substrate;
   providing a memory cell region and a dummy cell region in the semiconductor substrate;

forming a plurality of bit lines in the semiconductor substrate;

providing an oxide-nitride-oxide layer over the plurality of bit lines in the memory cell region;

providing a layer of non-trapping material over the plurality of bit lines in the dummy cell region, wherein the non-trapping material comprises an oxide; and providing a plurality of word lines over the oxide-nitride-oxide layer and the layer of non-trapping material in the memory cell region and the dummy cell region.

7. The method as claimed in claim 6, wherein the layer of non-trapping material provided in the dummy cell region has a same thickness as the oxide-nitride-oxide layer provided in the memory cell region.

8. The method as claimed in claim 6, further comprising patterning and etching the oxide-nitride-oxide layer to form a plurality of gate dielectrics.

9. The method as claimed in claim 6, further comprising patterning and etching the layer of non-trapping material to form a plurality of dummy cell gate dielectrics.

10. The method as claimed in claim 6, wherein a width of the bit lines under the word lines in the dummy cell region is smaller than a width of the bit lines under the word lines in the memory cell region.

11. The method as claimed in claim 6, wherein providing an oxide-nitride-oxide layer over the plurality of bit lines in the memory cell region further comprises masking the dummy cell region.

12. The method as claimed in claim 6, wherein providing a layer of non-trapping material over the plurality of bit lines in the dummy cell region further comprises masking the memory cell region.

13. A method for manufacturing a semiconductor device, comprising:

providing a semiconductor substrate;

providing a memory cell region and a dummy cell region in the semiconductor substrate;

forming at least one memory cell in the memory cell region, including providing a first source region and a first drain region in the semiconductor substrate, providing an oxide-nitride-oxide layer over the first source and drain regions, patterning and etching the oxide-nitride-oxide layer to form at least one gate dielectric, and providing a first gate over the at least one gate dielectric; and forming at least one dummy cell in the dummy cell region, including providing a second source region and a second drain region in the semiconductor substrate, providing a layer of non-trapping material over the second source and drain regions, wherein the non-trapping material comprises one of silicon dioxide and aluminum oxide, patterning and etching the layer of non-trapping material to form at least one dummy gate dielectric, and providing a second gate over the layer of non-trapping material.

14. The method as claimed in claim 13, wherein a distance between the first source region and the first drain region defines a first channel length, and a distance between the second source region and the second drain region defines a second channel length.

15. The method as claimed in claim 14, wherein the second channel length is grater than the first channel length.

16. The method as claimed in claim 13, wherein the first source and drain regions are substantially parallel.

17. The method as claimed in claim 13, wherein the first gate and the gate are substantially parallel.

18. The method as claimed in claim 13, wherein the at least one memory cell is a nitride read only memory cell.

* * * * *

UNITED STATES PATENT AND TRADEMARK OFFICE
CERTIFICATE OF CORRECTION

PATENT NO. : 6,787,860 B1
DATED : September 7, 2004
INVENTOR(S) : Huang et al.

It is certified that error appears in the above-identified patent and that said Letters Patent is hereby corrected as shown below:

Title page,
Item [57], ABSTRACT,
Line 7, "oxide-nitrideoxide" should read -- oxide-nitride-oxide --.

Column 6,
Line 30, "grater" should read -- greater --.
Line 34, "the gate" should read -- the second gate --.

Signed and Sealed this

First Day of March, 2005

JON W. DUDAS
*Director of the United States Patent and Trademark Office*